United States Patent
Eidelman et al.

(10) Patent No.: US 10,381,166 B2
(45) Date of Patent: Aug. 13, 2019

(54) HIGH PERFORMANCE AND RELIABILITY SOLID ELECTROLYTIC TANTALUM CAPACITORS AND SCREENING METHOD

(71) Applicant: Vishay Sprague, Inc., Bennington, VT (US)

(72) Inventors: Alex Eidelman, Beer Sheva (IL); Yongjian Qiu, Greenville, SC (US); Pavel Vaisman, Omer (IL); Yuri Stangrit, Beer Sheva (IL); Rita Eisenberg, Beer Sheva (IL); Natali Ostrovsky, Beer Sheva (IL)

(73) Assignee: Vishay Sprague, Inc., Bennington, VT (US)

( * ) Notice: Subject to any disclaimer, the term of this patent is extended or adjusted under 35 U.S.C. 154(b) by 96 days.

(21) Appl. No.: 15/164,178

(22) Filed: May 25, 2016

(65) Prior Publication Data

US 2017/0345579 A1    Nov. 30, 2017

(51) Int. Cl.
| | |
|---|---|
| *G01R 31/12* | (2006.01) |
| *H01G 9/042* | (2006.01) |
| *H01G 9/012* | (2006.01) |
| *H01G 9/025* | (2006.01) |
| *H01G 9/14* | (2006.01) |
| *G01R 31/02* | (2006.01) |

(52) U.S. Cl.
CPC ........... *H01G 9/042* (2013.01); *G01R 31/028* (2013.01); *G01R 31/1227* (2013.01); *H01G 9/012* (2013.01); *H01G 9/025* (2013.01); *H01G 9/14* (2013.01)

(58) Field of Classification Search
None
See application file for complete search history.

(56) References Cited

U.S. PATENT DOCUMENTS

| | | | | |
|---|---|---|---|---|
| 4,216,424 | A | * 8/1980 | Vette | G01R 27/2605 324/548 |
| 4,583,038 | A | * 4/1986 | Chittick | G01N 27/20 324/548 |
| 4,876,451 | A | 10/1989 | Ikeda et al. | |
| 5,469,326 | A | 11/1995 | Kanetake | |
| 5,882,719 | A | 3/1999 | Creasi, Jr. | |

(Continued)

FOREIGN PATENT DOCUMENTS

| | | |
|---|---|---|
| EP | 1 096 520 A1 | 5/2001 |
| EP | 1 143 465 A1 | 10/2001 |

(Continued)

OTHER PUBLICATIONS

Vishay "vPolyTan™ Solid Tantalum Surface Mount Chip Capacitors, Multianode, Leadframeless Molded Polymer Type, Commercial Off-The-Shelf (COTS)" Revised Jul. 16, 2015 (5 pages).

(Continued)

*Primary Examiner* — Patrick Assouad
*Assistant Examiner* — Demetrius R Pretlow
(74) *Attorney, Agent, or Firm* — Volpe and Koenig, P.C.

(57) ABSTRACT

Disclosed are tantalum capacitors having enhanced volumetric efficiency, effective series resistance, effective series inductance, and high frequency performance when compared to existing tantalum capacitors. Also disclosed is a screening process for tantalum capacitors to enhance reliability.

10 Claims, 20 Drawing Sheets

| (510) DESIGN | (515) SCHEMATIC VIEW (CROSS-SECTION TOP) | (520) PERSPECTIVE VIEW |
|---|---|---|
| DOUBLE ANODE DESIGN WITH PARALLEL ANODES (PELLETS PLACED SIDE BY SIDE) | (515a) | (520a) |
| TRIPLE ANODE DESIGN WITH PARALLEL ANODES (PELLETS PLACED SIDE BY SIDE) | (515b) | (520b) |
| STACKED CAPACITORS WITH PARALLEL ANODES (ONE ON TOP OF THE OTHER) | (515c) | (520c) |

(56) References Cited

U.S. PATENT DOCUMENTS

| | | | |
|---|---|---|---|
| 6,212,065 B1* | 4/2001 | Pozdeev-Freeman | ........................ H01G 9/012 29/25.03 |
| 6,229,687 B1 | 5/2001 | Wada et al. | |
| 6,238,444 B1 | 5/2001 | Cadwallader | |
| 6,346,127 B1 | 2/2002 | Kuriyama | |
| 6,380,577 B1 | 4/2002 | Cadwallader | |
| 6,920,037 B2 | 7/2005 | Sano et al. | |
| 6,992,880 B2 | 1/2006 | Tadanobu et al. | |
| 7,161,797 B2 | 1/2007 | Vaisman et al. | |
| 7,196,899 B1 | 3/2007 | Feger et al. | |
| 7,449,032 B2 | 11/2008 | Vaisman et al. | |
| 7,671,603 B2 | 3/2010 | Freeman | |
| 8,004,288 B1 | 8/2011 | Sherwood et al. | |
| 9,870,869 B1* | 1/2018 | Liu | ........................ H01G 9/145 |
| 2002/0054470 A1 | 5/2002 | Kuriyama | |
| 2004/0103508 A1 | 6/2004 | Kanetake | |
| 2004/0147960 A1 | 7/2004 | O'Phelan et al. | |
| 2004/0154149 A1 | 8/2004 | Melody et al. | |
| 2007/0081301 A1 | 4/2007 | Tanaka | |
| 2008/0143342 A1* | 6/2008 | Freeman | ............... G01R 31/016 324/548 |
| 2010/0188099 A1* | 7/2010 | Paulsen | ................ G01R 31/016 324/548 |
| 2011/0051317 A1* | 3/2011 | Fujimoto | ................ H01G 9/012 361/512 |
| 2011/0261505 A1* | 10/2011 | Matsuoka | .............. H01G 9/012 361/533 |
| 2012/0127632 A1* | 5/2012 | Evans | .................... H01G 9/022 361/504 |
| 2014/0042536 A1 | 2/2014 | Yedinak et al. | |
| 2014/0067303 A1* | 3/2014 | Millman | .............. G01R 31/016 702/84 |
| 2014/0226258 A1 | 8/2014 | Summey et al. | |
| 2014/0293512 A1* | 10/2014 | Tanaka | .................... H01G 9/15 361/525 |

FOREIGN PATENT DOCUMENTS

| | | |
|---|---|---|
| EP | 1 160 809 A1 | 12/2001 |
| JP | 2002-175939 A | 6/2002 |

OTHER PUBLICATIONS

International Preliminary Report on Patentability, dated Jun. 29, 2018, in co-pending International Application No. PCT/US2017/032852.

Pothier, Charles, New T42 Series of Fused Hi-Rel Surface-Mount Solid Tantalum Molded Chip Capacitors, Apr. 2014, 2 pages.

Zednicek, et al., Low ESR SMD Tantalum Capacitors for Aerospace Applications, Space Passive Component Days, 1st International Symposium—ESA/ESTEC—Sep. 24-26, 2013, 32 pages.

Decker, Bob, New Tantalum Chip Capacitor Combines Capacitance of 1500 μF with ESR Values of 13mΩ, Dec. 16, 2002, 1 page.

Vishay Sprague, Solid Tantalum Chip Capacitors, Document No. 40091, Revision: Jun. 27, 2008, 4 pages.

* cited by examiner

| DESIGN (510) | SCHEMATIC VIEW (CROSS-SECTION TOP) (515) | PERSPECTIVE VIEW (520) |
|---|---|---|
| DOUBLE ANODE DESIGN WITH PARALLEL ANODES (PELLETS PLACED SIDE BY SIDE) | (515a) | (520a) |
| TRIPLE ANODE DESIGN WITH PARALLEL ANODES (PELLETS PLACED SIDE BY SIDE) | (515b) | (520b) |
| STACKED CAPACITORS WITH PARALLEL ANODES (ONE ON TOP OF THE OTHER) | (515c) | (520c) |

FIG. 5

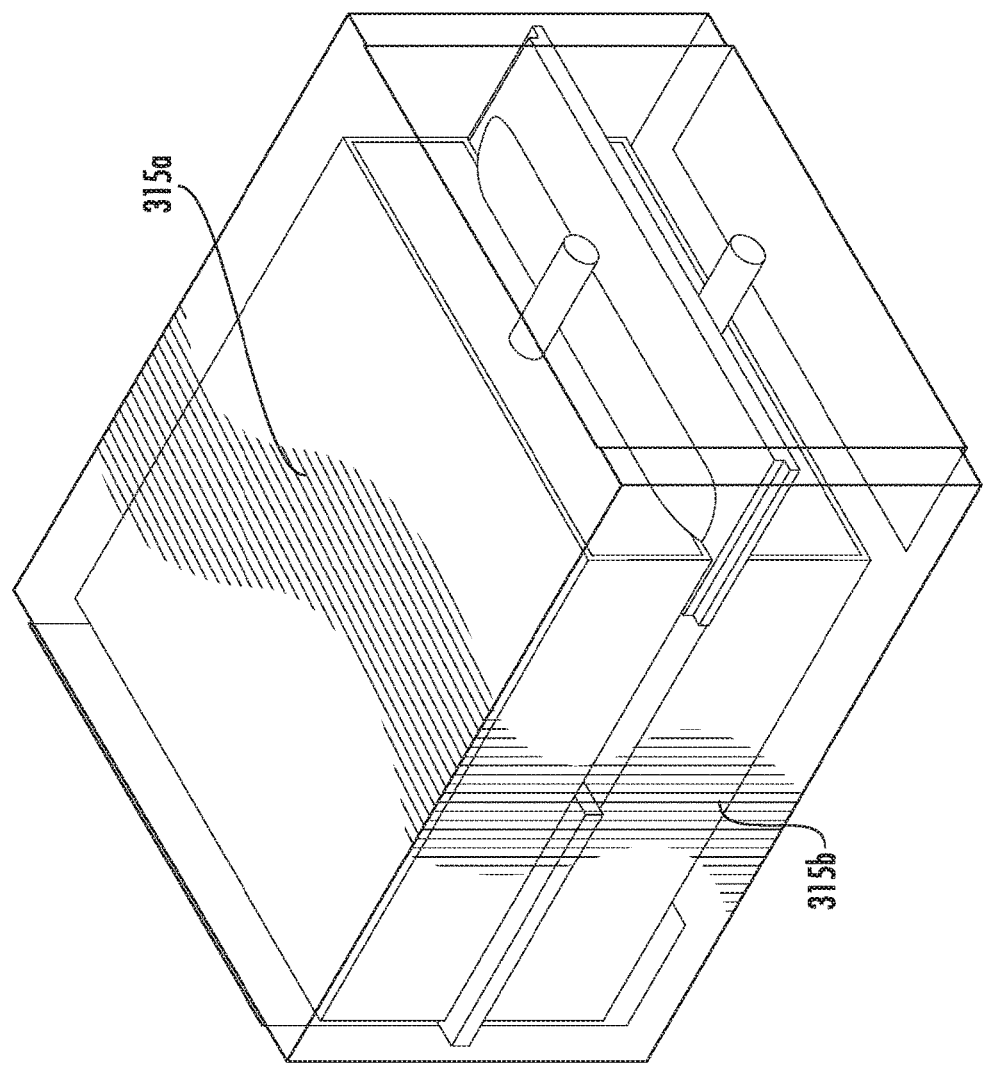

HIGH PERFORMANCE AND RELIABILITY SOLID ELECTROLYTIC TANTALUM CAPACITORS AND SCREENING METHOD

FIELD OF INVENTION

This invention is directed to electronic components, and more specifically, to capacitors formed in groups, stacks or multi-array packages (MAP), and methods for screening such capacitors.

BACKGROUND

Recent technological advancements lead to demands for further miniaturization of electronic components through, for example, higher packing efficiency. The need also exists for better high frequency performance, and more robust reliability for applications in automotive, avionics, military, and space exploration. Solid electrolytic tantalum capacitors are widely used in those fields based on their high performances and reliability. U.S. Pat. Nos. 7,161,797 and 7,449,032, the entire contents of which are incorporated by reference herein, disclose a multi-array package (MAP) design and a manufacturing process that makes surface mount tantalum capacitors with high capacitance in a relatively small package size.

There remains a need for various arrangements of anodes and cathodes within MAP designs for capacitors having multiple capacitor elements.

There further remains the need for an efficient and accurate method for screening capacitors having MAP designs and arrangements in order to choose the most reliable ones.

SUMMARY

The present invention is directed, in an aspect, to tantalum capacitors that are advantageous over previous tantalum capacitors in packing density (volumetric efficiency), electronic performance, and reliability. Highly reliable solid tantalum capacitors and methods of their manufacture are described. The capacitors feature, generally, a conductive polymer cathode, efficient package construction including stacking of multiple anode capacitor elements, and high reliability due to a disclosed screening process. A screening process is also provided for testing the performance of such capacitors.

In an aspect of the invention, a method for screening a capacitor having a single or a plurality of anodes and having a multi-array package design is provided. The method comprises the steps of applying a voltage exceeding the voltage rating of the capacitor, applying an elevated temperature to the capacitor, measuring the DC leakage current of the capacitor, and comparing the DC leakage current to a predetermined maximum.

In another aspect of the invention, a capacitor constructed in a multi-array package (MAP) configuration, comprises a molded body encasing at least two capacitor elements. The capacitor elements are connected to at least one substrate. The substrate may form a planar surface with the molded body. The capacitor elements each have a cathode portion electrically connected to a cathode terminal, and an anode portion electrically connected to an anode terminal.

BRIEF DESCRIPTION OF THE DRAWINGS

A more detailed understanding may be had from the following description, given by way of example in conjunction with the accompanying drawings wherein:

FIG. 5 shows examples of views of configurations of MAP capacitors, according to the present invention.
FIG. 8A shows a perspective view in partial transparency of an embodiment of a MAP capacitor assembly according to the invention.

DETAILED DESCRIPTION

Figure 1A:
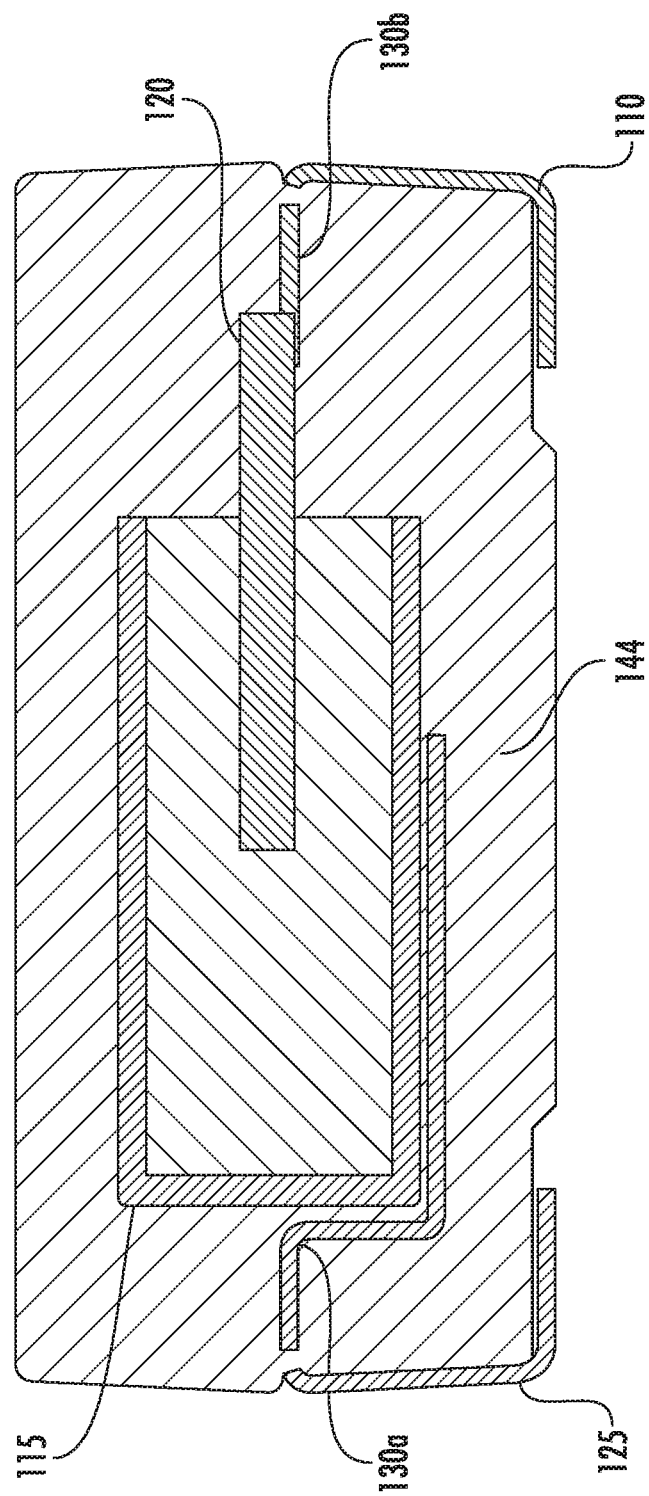
FIG. 1A shows a cross-sectional view of a capacitor.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

Disclosed herein are structures and processes for manufacturing high reliability solid tantalum capacitors. The structures disclosed herein yield devices with higher volumetric efficiency, lower equivalent series resistance (ESR) and lower equivalent series inductance (ESL) compared to previous capacitors. In addition, related processes ensure long term reliability of the products.

Tantalum capacitors, and methods for screening, reviewing and/or otherwise testing performance of tantalum capacitors according to the present invention include one or more of the following characteristics:

1. Tantalum (Ta) capacitor elements (anodes) are processed by coating the anodes with a conducting polymer to form the cathode layer.

2. A capacitor structure according to the invention uses multi-array package (MAP) configurations resulting in lower ESR and ESL. In turn, the lower ESR and ESL lead to superior high-frequency performance.

3. The high-frequency performance of the capacitors according to an aspect of the invention are further improved for devices in multi-array package (MAP) configurations by (i) assembling multiple anodes in parallel in a single package or (ii) stacking multiple anodes into a single package to effectively reduce ESR and ESL.

4. The finished capacitor devices and arrays are screened under an elevated temperature and at a voltage exceeding the device rated voltage to achieve exceptional reliability.

In an embodiment of a capacitor and/or capacitor arrangement according to the present invention, tantalum anodes may be anodized to form a dielectric layer, and coated with a conducting polymer to form a cathode layer of predetermined thickness. The anodes may then be ready for assembly after coating with graphite and silver paste to form the current collecting layers.

The capacitor elements are assembled in single, double, or multiple anodes on a substrate using a multi-array package (MAP) process disclosed, for example, in U.S. Pat. Nos. 7,161,797 and 7,449,032, the entire contents of which are hereby incorporated by reference as if fully set forth herein. In these configurations, cathodes and cathode leads may or may not be common among any of the individual capacitors. Likewise, anodes and anode leads may or may not be common among any of the individual capacitors.

Figure 1B:
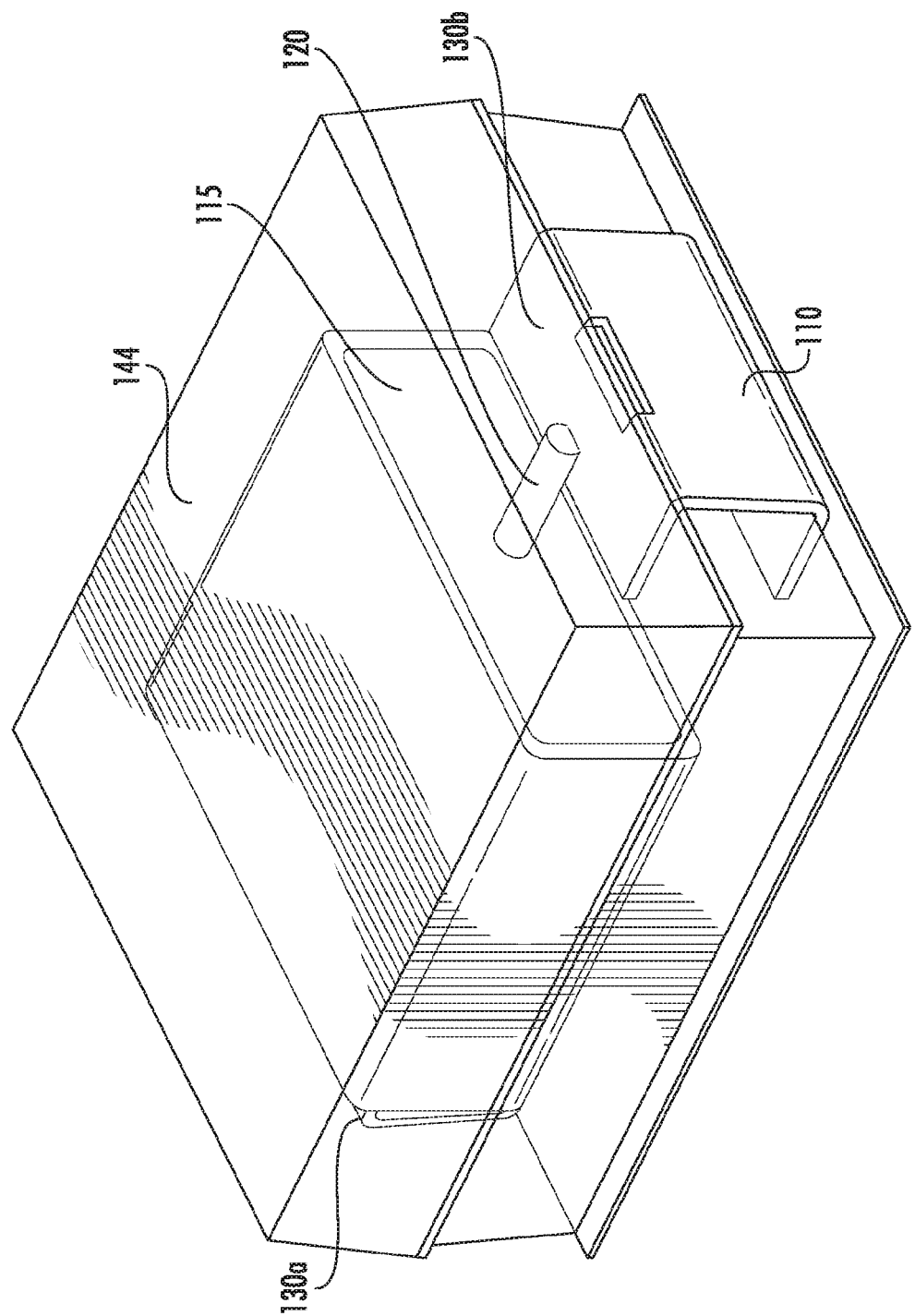
FIG. 1B shows a perspective view of the capacitor of FIG. 1A, in partial transparency.

FIGS. 1A and 1B show an example tantalum capacitor. The capacitor includes a tantalum capacitor element formed as a pellet 115, a tantalum anode wire 120 embedded in and making electrical contact with an anode portion of the tantalum capacitor pellet 115, and an anode terminal 110 electrically connected to the tantalum wire 120 providing an anode connection terminal outside a package of molded resin body 144 that may encase the tantalum capacitor pellet 115. Also included is a cathode terminal 125 electrically connected to the capacitor cathode and providing a cathode connection terminal outside the package.

As shown in FIGS. 1A and 1B, a substrate is provided as substrate portions 130a and 130b. The substrate portion 130a is positioned adjacent a cathode end of the capacitor, and internally within the molded resin body 144, having a multi-portion bent or stepped design, taking up volume within the molded resin body 144. Substrate portion 130b is similarly positioned with the molded resin body 144.

Figure 2A:
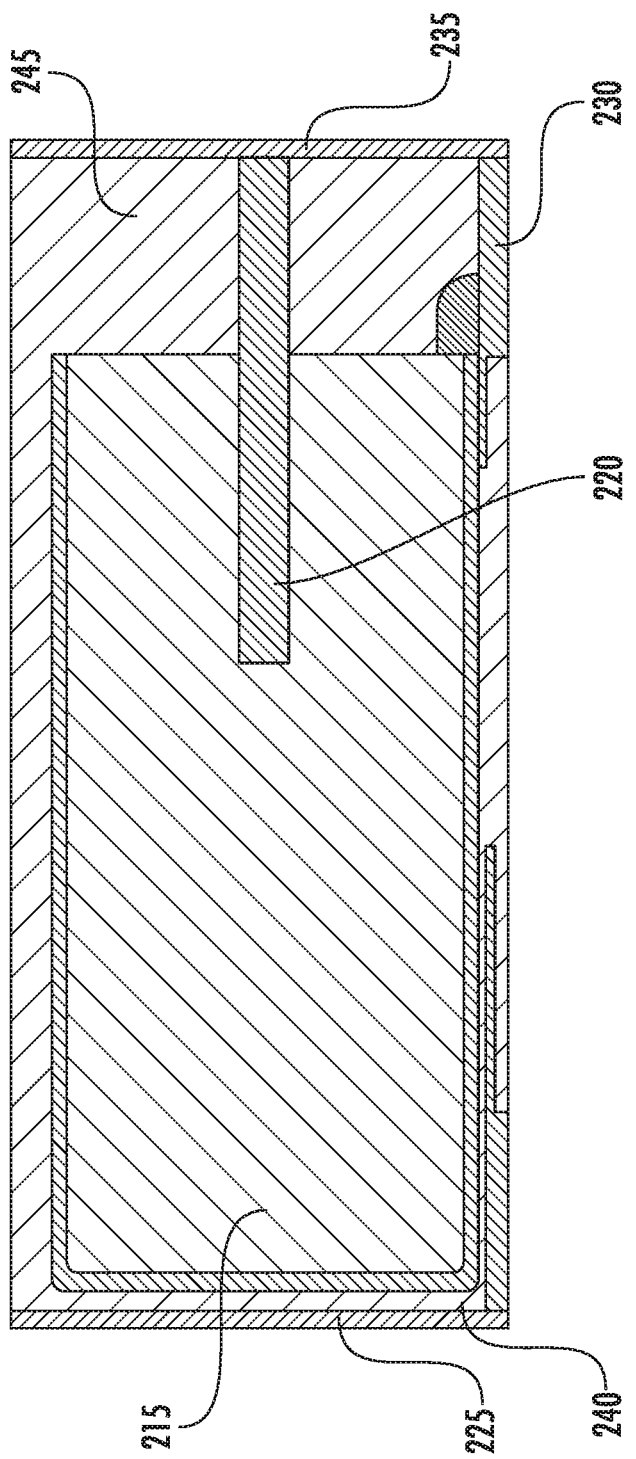
FIG. 2A shows a cross-sectional view of a MAP capacitor.
Figure 2B:
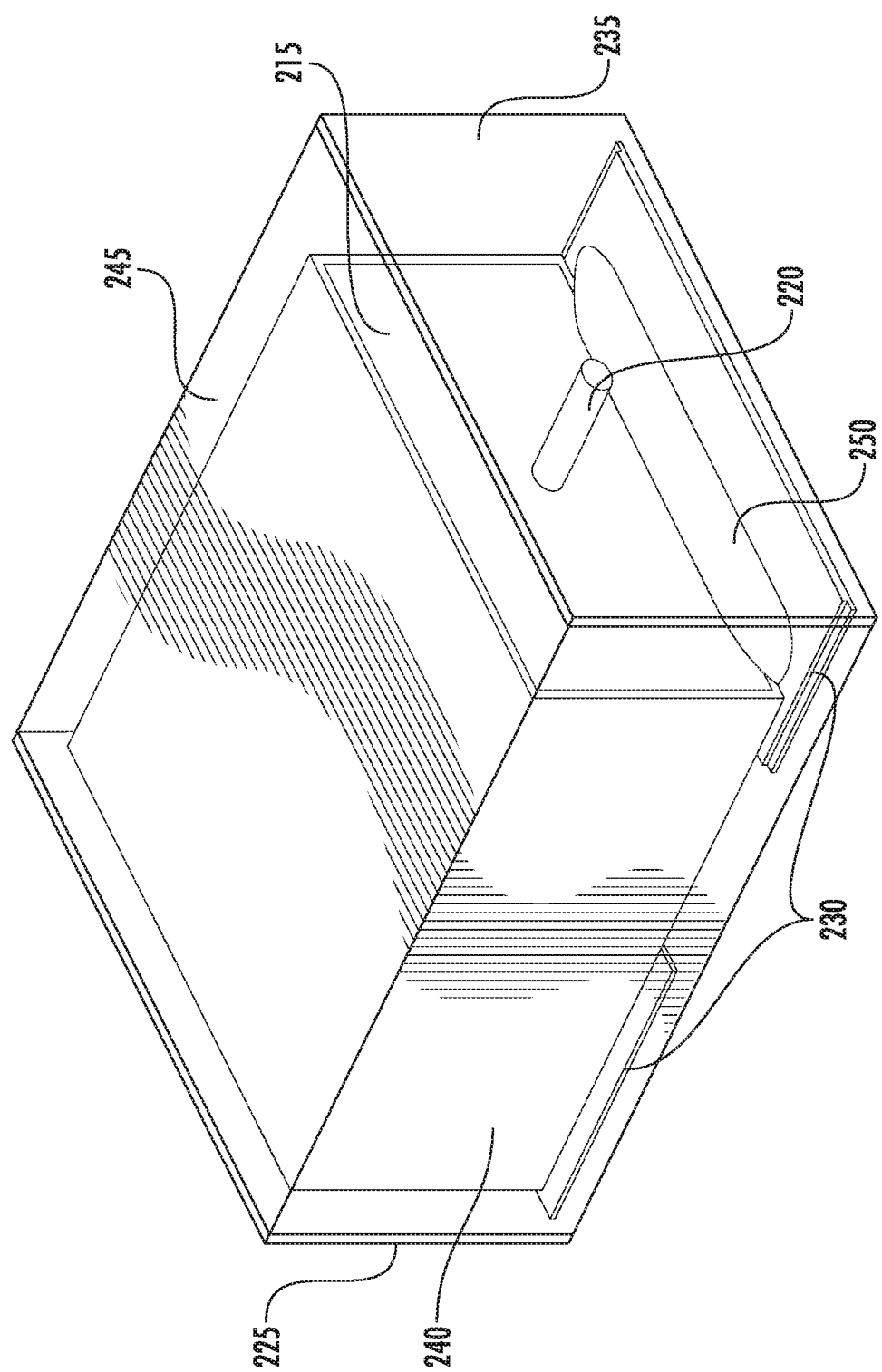
FIG. 2B shows a perspective view of the MAP capacitor of FIG. 2A, in partial transparency.

FIGS. 2A and 2B show a tantalum capacitor according to an aspect of the invention for use as part of a multi-array package (MAP) configuration according to the present invention. The capacitor shown in FIGS. 2A and 2B includes a tantalum capacitor element 215 (also sometimes referred to herein as the anode, pellet tantalum pellet, or tantalum capacitor pellet), and a tantalum anode wire 220 embedded in and making electrical contact with an anode portion of the tantalum capacitor pellet 215. An anode terminal 235 electrically connected to the tantalum wire 220 provides an anode connection terminal outside a package of a molded resin body 245 that may encase the body of the capacitor. Also included is a cathode terminal 225 electrically connected to the capacitor cathode and providing a cathode connection terminal outside the molded resin body 245. Conducting paste 240 may surround and cover at least a portion of the tantalum capacitor pellet 215. A non-conductive adhesive 250 may be used to attach a portion of the tantalum capacitor pellet 215 to a planar substrate portion 230, described in greater detail herein.

The structure of FIGS. 2A and 2B is constructed on a planar substrate 230 instead of an internal or bent or stepped substrate 130 as in FIGS. 1A and 1B, with the substrate 230 thereby occupying less space. Furthermore, in contrast to the prior structures such as shown in FIG. 1, the structure shown in FIGS. 2A and 2B is capable of having shorter electrical connections inside the package between the tantalum pellet and the anode and cathode terminals. Accordingly, if the size of the tantalum pellet is the same in both structures, the inventive structure will, by definition, occupy a smaller space, thereby increasing packing density and volumetric efficiency, i.e., capacitance per unit volume. Furthermore, from basic principles of electromagnetism as known in the art, the shorter electrical connections in the inventive structure of FIGS. 2A and 2B result in lower ESR and ESL and improved high-frequency performance, compared to the prior structures of FIG. 1.

Figure 3A:
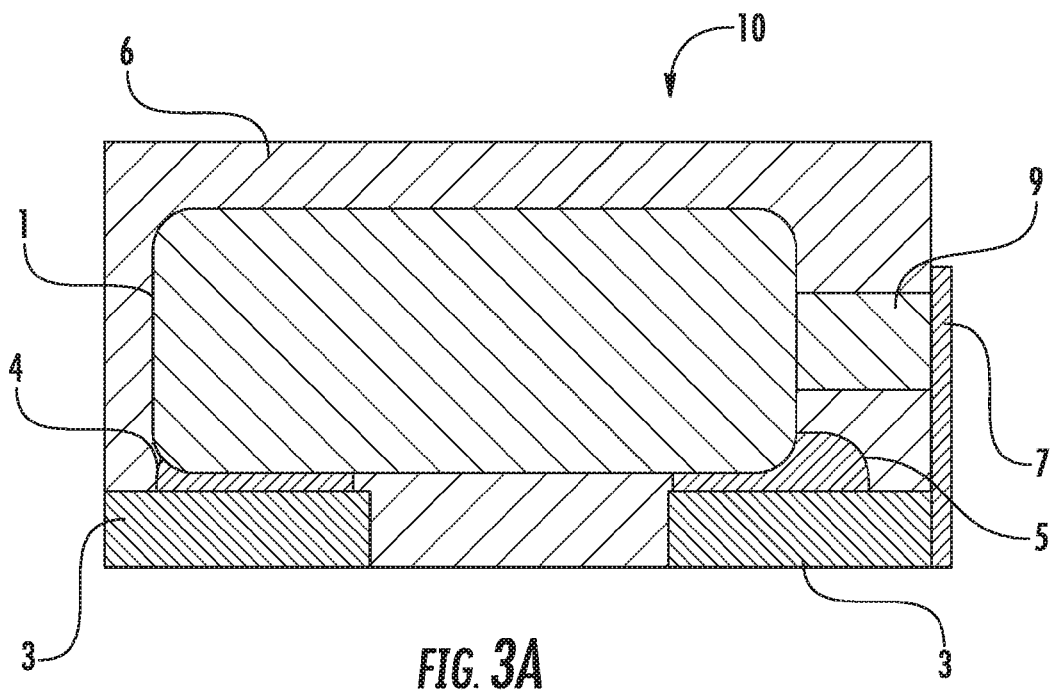
FIGS. 3A and 3B show example MAP capacitors that may be used in an arrangement according to the present invention.
Figure 3B:
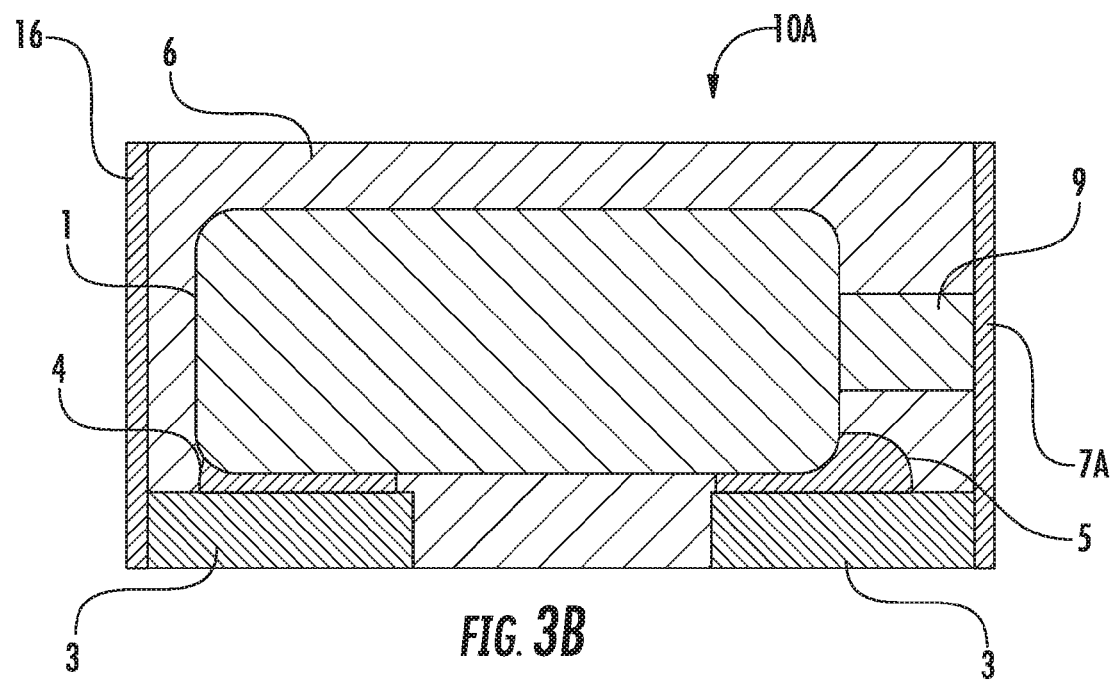

A capacitor arrangement that may be used as part of a device, arrangement, or process according to the inventions is shown in U.S. Pat. No. 7,161,797, the entire contents of which is incorporated by reference as if fully set forth herein. U.S. Pat. No. 7,161,797 describes a surface mount capacitor and a method for making the same. FIGS. 3A and 3B represent configurations shown in U.S. Pat. No. 7,161,797 and respectively show two such capacitors 10 and 10A. A solid slug or pellet anode body 1 is encapsulated in a case 6 of insulating material. An anode termination 3 and cathode termination 2 are formed with surface mount mounting portions on one side of the case 6. An internal electrical connection 4 is made from the cathode termination 2 to a cathode on pellet 1 through the case 6. An electrical connection 9, 7 or 7A is made between an anode associated with the pellet 1 and the anode termination 3 externally of the case 6. An electrically insulating adhesive 5 connects the portion of the pellet 1 adjacent the anode end to anode termination 3. An external connection 16 may be positioned along the wall of the cathode end of the capacitor. The external connection 7, 7A allows improved volumetric efficiency by freeing up space in the case 6 for a bigger pellet 1.

Figure 4A:
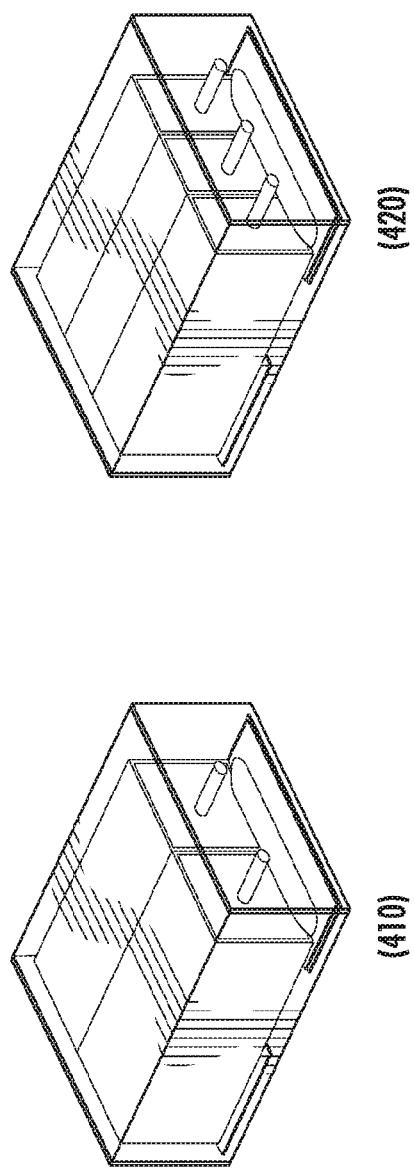
FIGS. 4A and 4B show perspective views in partial transparency of various arrangements of MAP capacitors according to an aspect of the invention.
Figure 4B:
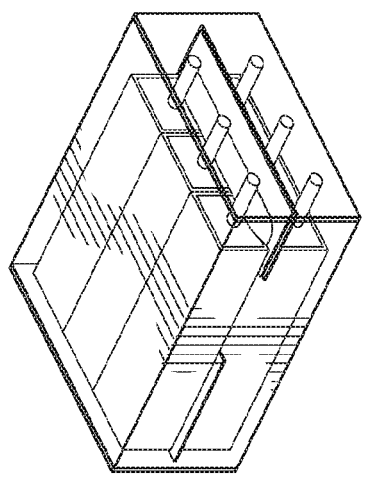
Figure 4B:
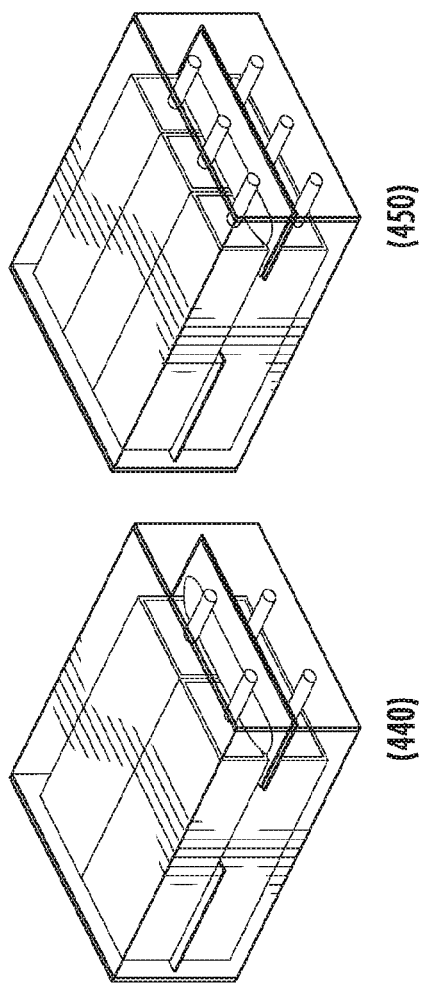
Figure 4B:
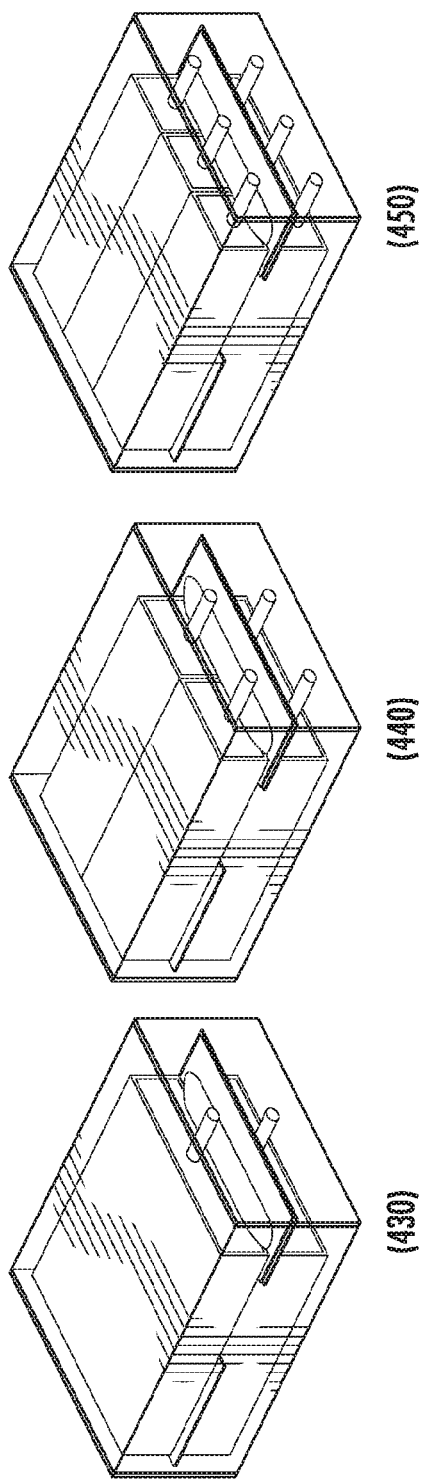

Two or more capacitor elements positioned on substrates, such as the example capacitor shown in FIGS. 2A and 2B, may be stacked and molded into a single plate, which may be processed into a single package, device, or unit. Examples of such configurations are illustrated in FIGS. 4A and 4B, showing example parallel arrangements of two (410) and three (420) capacitor elements, and stacked arrangements of two (430), four (440), and six (450) capacitor elements. The numbers of capacitor elements shown in each example of FIGS. 4A and 4B, and the positioning of the capacitor elements, are not to be construed as limiting, and are for illustration purposes only.

FIG. 5 shows examples of different views of illustrative configurations of capacitor elements, in various parallel (i.e., side-by-side) and stacked configurations, according to the present invention. Column (510) provides design descriptions of various arrangements. Column (515) provides corresponding top cross-sectional views. Column (520) provides corresponding perspective views.

Figure 6A:
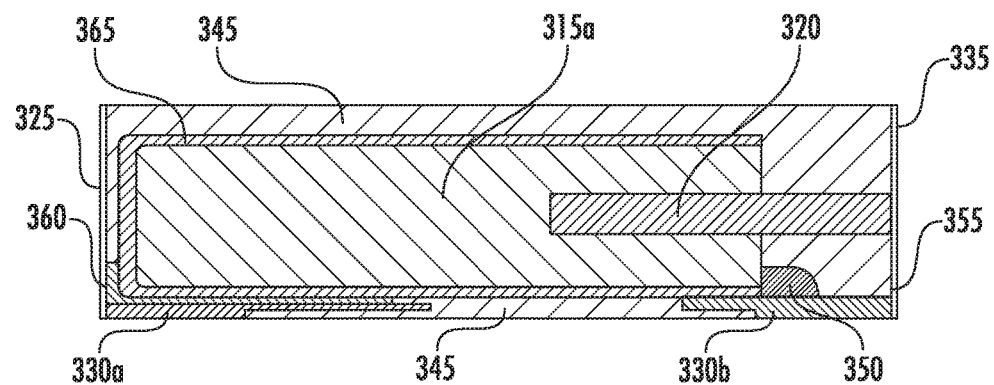
FIG. 6A shows a side cross-sectional view of an embodiment of a MAP capacitor assembly as shown in FIG. 5 as 520(a).
Figure 6B:
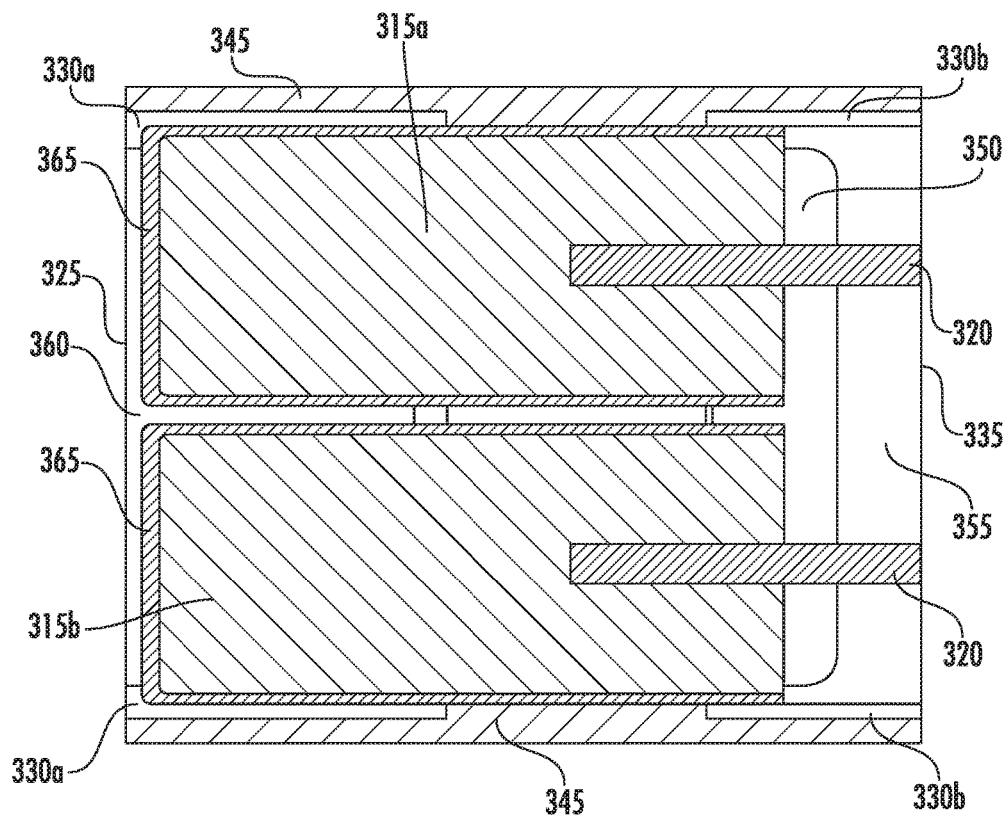
FIG. 6B shows the top cross-sectional view the embodiment of a MAP capacitor assembly shown in FIG. 5 as 515(a) in greater detail.

FIGS. 6A and 6B show a multiple capacitor element arrangement as shown (relating to configurations shown in FIG. 4A, (410), and FIG. 5, (515a) and (520a)) in a multi-array package (MAP) including a two capacitor element (anode) arrangement, with the capacitor elements positioned in parallel (side-by-side). A capacitor element is formed as a tantalum capacitor pellet 315a,b (shown separately for individual anode bodies as 315a, 315b), with tantalum anode lead wires 320 embedded in or otherwise bonded to or joined to, and making electrical contact with, an anode portion of each of the tantalum capacitor pellets 315a, 315b. A molded resin body 345 encapsulates the capacitor arrangement. An anode terminal 335 is electrically connected to the anode lead wires 320 and provides an anode connection terminal outside the package of the molded resin body 345. An isolative epoxy 350 bonds the anode portions of the capacitor to an anode terminal substrate 330b that has been at least partially coated at its upper surface with an isolative epoxy 355.

A conductive cathode coating 365 is formed surrounding a portion of the tantalum capacitor pellet 315a, 315b, leaving exposed the anode portion of the tantalum capacitor pellet 315a, 315b. A conductive adhesive epoxy 360 electrically bonds the cathode 365 to a cathode terminal 325 providing a cathode connection terminal outside the molded resin body 345. The conductive adhesive epoxy 360 also bonds the cathode 365 portion to a cathode terminal substrate 330a.

The capacitor arrangement shown in FIGS. 6A and 6B provides a two capacitor package, with capacitor elements side-by-side, where the capacitor elements 315a, 315b share at least an anode terminal 335, a cathode terminal 325, substrates 330a, 330b, conductive adhesive epoxy 360, and isolative epoxy 355. As in FIGS. 6A and 6B, anode lead wires 320 and conductive cathode coatings 365 are provided. The shared substrates 330a, 330b, along with the bottom surface of the molded resin body 345 between the substrates 330a, 330b, form a planar lower surface of the capacitor package. The substrates 330a, 330b do not take up volume within the interior of the molded resin body 345, as in prior known capacitor arrangements. In addition to other advantages, this arrangement allows for a more efficient use of capacitor volume, and a flatter package.

Figure 7:
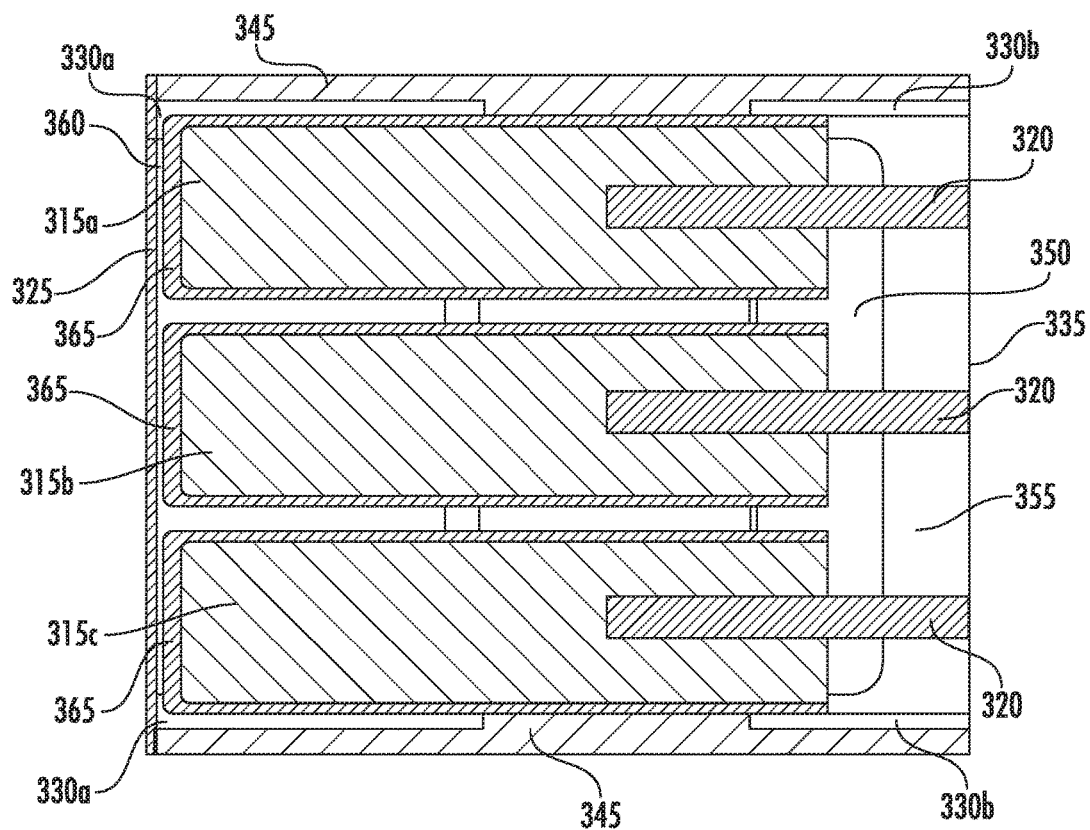
FIG. 7 shows the top cross-sectional view the embodiment of a MAP capacitor assembly shown in FIG. 5 as 515(b) in greater detail.

FIG. 7 shows a multiple capacitor arrangement (relating to FIG. 4A, (420), and FIG. 5, (515b) and (520b)) in a multi-array package (MAP) including a three anode arrangement, in parallel. Three capacitor elements 315a, 315b, and 315c are provided in parallel. This arrangement is similar to the arrangement shown in FIGS. 6A and 6B, but with a three capacitor package, where the capacitor elements 315a, 315b, and 315c share at least an anode terminal 335, a cathode terminal 325, substrates 330a, 330b, conductive adhesive epoxy 360, and isolative epoxy 355. The shared substrates 330a, 330b, along with the bottom surface of the molded resin body 345 between the substrates 330a, 330b form a planar lower surface of the capacitor package. The substrates 330a, 330b do not take up volume within the interior of the molded resin body 345, as in prior known capacitor arrangements. In addition to other advantages, this arrangement allows for a more efficient use of capacitor volume, and a flatter package. The side cross-sectional view of an individual capacitor element 315a, 315b, and 315c of FIG. 7 would be the same as or similar to FIG. 6A.

Figure 8B:
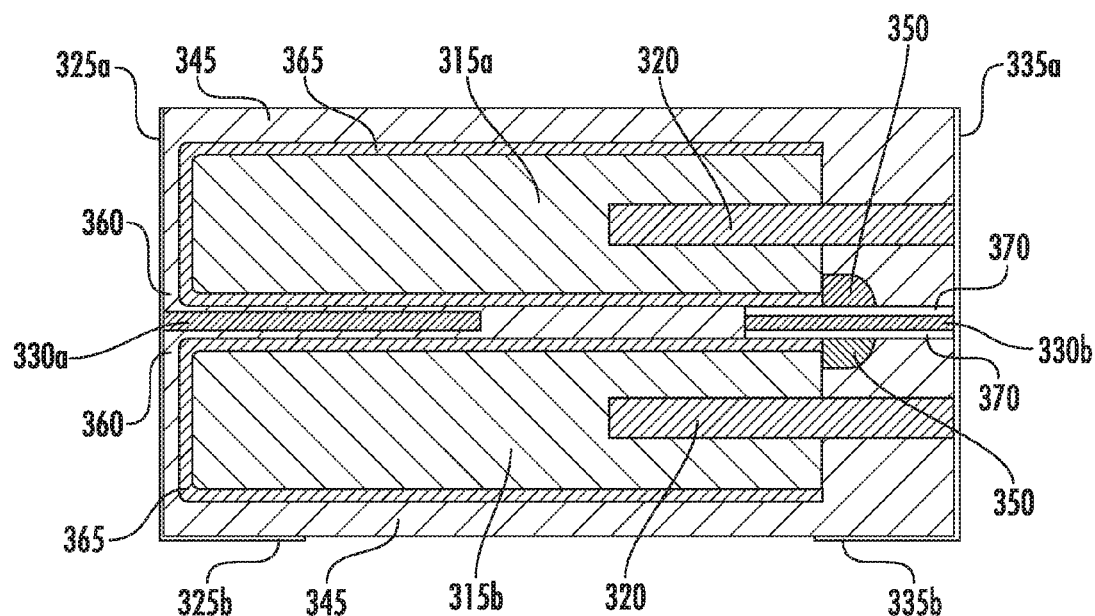
FIG. 8B shows a side cross-sectional view of the capacitor assembly of FIG. 8A.
Figure 8C:
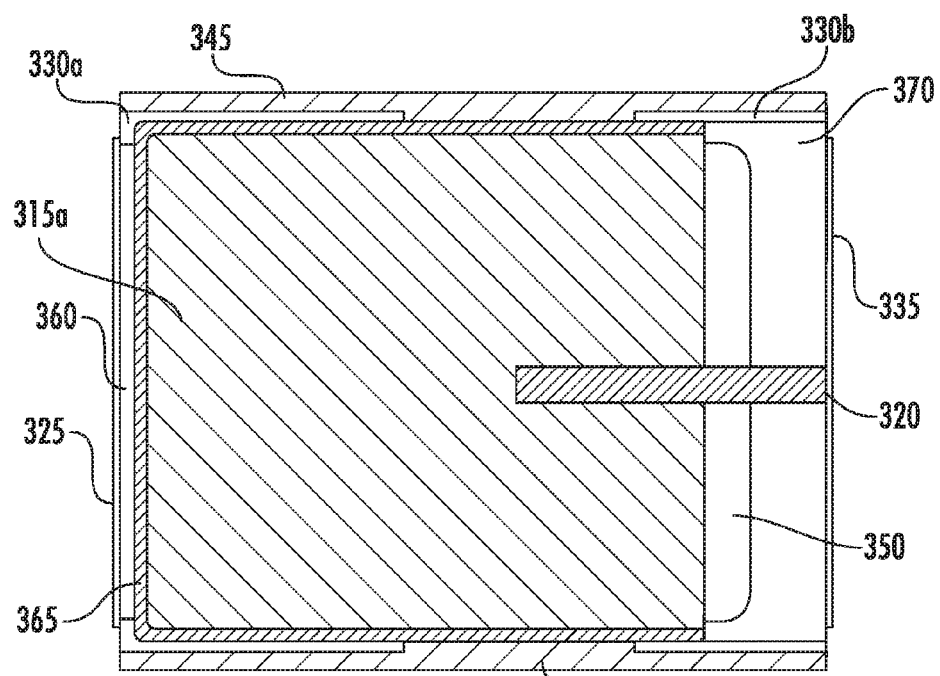
FIG. 8C shows a top cross-section view of the MAP capacitor assembly of FIG. 8A.

FIGS. 8A, 8B, and 8C show a different arrangement for a capacitor package according to the invention. In the arrangement shown in FIGS. 8A, 8B and 8C, capacitor elements 315a and 315b that are wider and thus have a larger surface area and footprint than other capacitor elements shown are stacked one on top of another. That is, a top or upper capacitor element 315a is stacked on top of a bottom or lower capacitor element 315b. In this arrangement, the bodies of the capacitor elements 315a, 315b are wider than in the embodiments shown in FIGS. 6A, 6B, and 7. The substrates 330a, 330b are positioned within the molded resin body 345, at about the middle of the molded resin body 345, and between the capacitor elements 315a, 315b.

As shown in FIGS. 8A, 8B, and 8C, the capacitor elements 315a, 315b have facing conductive adhesive epoxy 360, joining each conductive cathode coating 365 to the cathode terminal substrate 330a. At the anode end portions of the capacitor elements 315a, 315b, the anode terminal substrate 330b is coated on its top and bottom surfaces with non-conductive protective strips 370. An insulating adhesive epoxy 350 bonds the anode portions of the capacitor elements 315a, 315b to the protective strips 370.

A generally L-shaped cathode terminal has a first portion 325a along a cathode surface of the capacitor package, and a second portion 325b along a lower surface of the of the capacitor package adjacent the cathode. The cathode terminal 325a, 325b is electrically connected to each cathode 365 via the conductive adhesive epoxy 360. A generally L-shaped anode terminal has a first portion 335a along an anode surface of the capacitor package, and a second portion 335b along a lower surface of the of the capacitor package adjacent the anode. These configurations allow for a surface mountable device. The arrangement of FIGS. 8A, 8B, and 8C provide for stacked capacitor elements, while still efficiently utilizing the available volume for the capacitor packages.

Figure 9A:
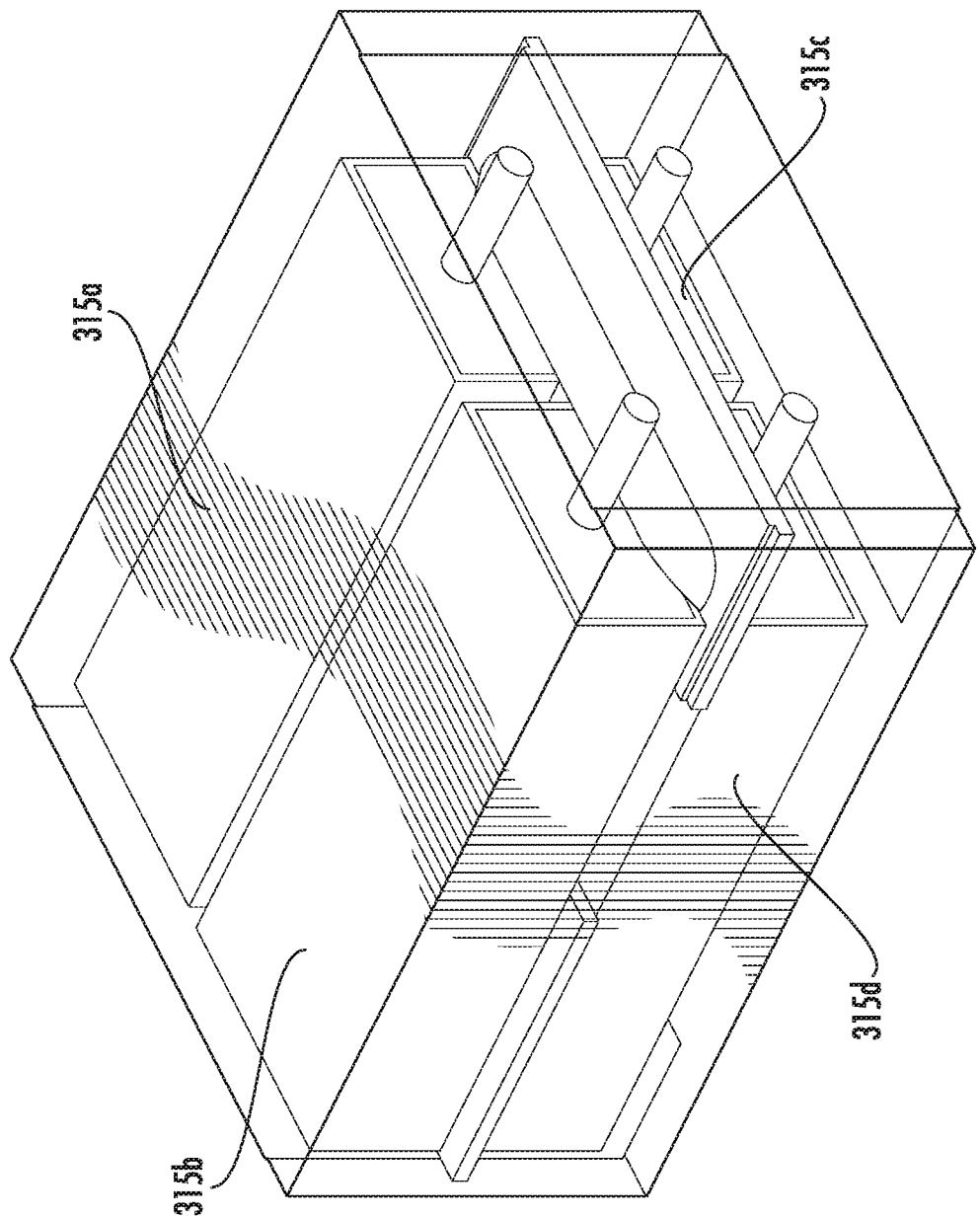
FIG. 9A shows a perspective view in partial transparency of an embodiment of a MAP capacitor assembly according to the invention.
Figure 9B:
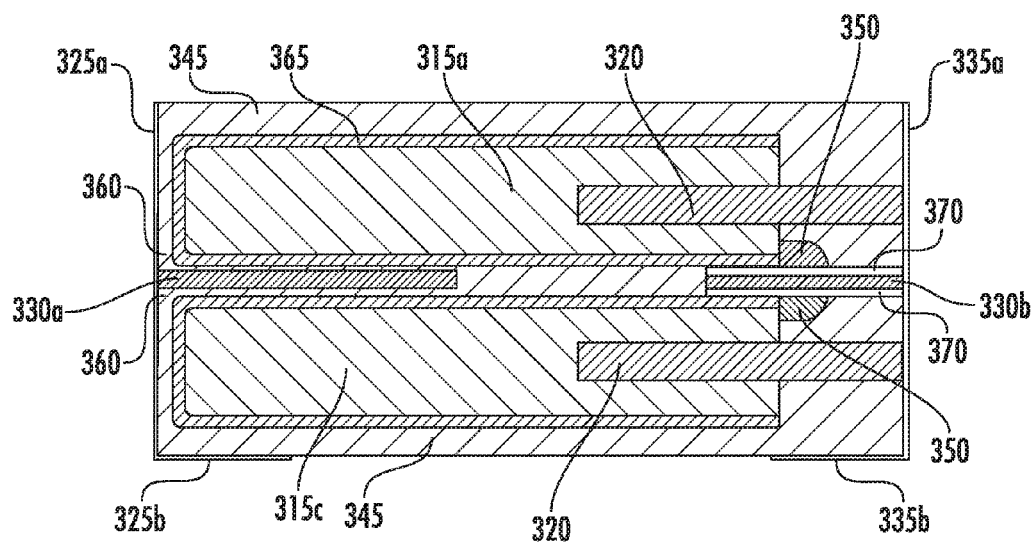
FIG. 9B shows a side cross-sectional view of the MAP capacitor assembly of FIG. 9A.
Figure 9C:
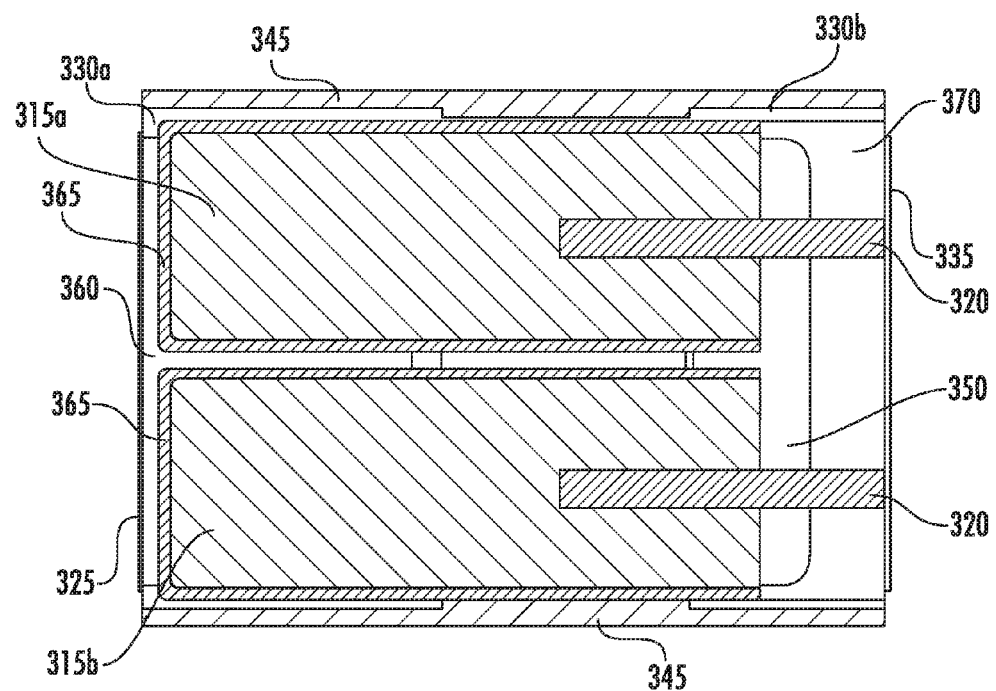
FIG. 9C shows a top cross-section view of the MAP capacitor assembly of FIG. 9A.

In another embodiment, as shown in FIGS. 9A, 9B, and 9C, a four capacitor element arrangement (relating to the arrangement of FIG. 4B (440), and also shown in FIGS. 5 (515c) and (520c)) is provided. As shown in FIGS. 9A, 9B, and 9C, two capacitor elements 315a and 315b, are positioned in parallel/side-by-side in a top or upper row of a stack. In addition, two capacitor elements 315c and 315d are positioned parallel in a bottom or lower row of the stack. As shown in FIGS. 9A, 9B, and 9C, the capacitor elements 315a and 315c, and capacitor elements 315b and 315d have facing conductive adhesive epoxy 360, joining each conductive cathode coating 365 to the cathode terminal substrate 330a. At the anode end portions of the capacitor elements, the anode terminal substrate 330b is coated on its top and bottom surfaces with non-conductive protective strips 370.

An insulating adhesive epoxy 350 bonds the anode portions of the capacitor elements 315a, 315b to the protective strips 370.

A generally L-shaped cathode terminal has a first portion 325a along a cathode surface of the capacitor package, and a second portion 325b along a lower surface of the of the capacitor package adjacent the cathode. The cathode terminal 325a, 325b is electrically connected to each cathode 365 via the conductive adhesive epoxy 360. A generally L-shaped anode terminal has a first portion 335a along an anode surface of the capacitor package, and a second portion 335b along a lower surface of the of the capacitor package adjacent the anode. These configurations allow for a surface mountable device. The arrangement of FIGS. FIGS. 9A, 9B, and 9C provide for stacked capacitor elements, while still efficiently utilizing the available volume for the capacitor packages.

Figure 10A:
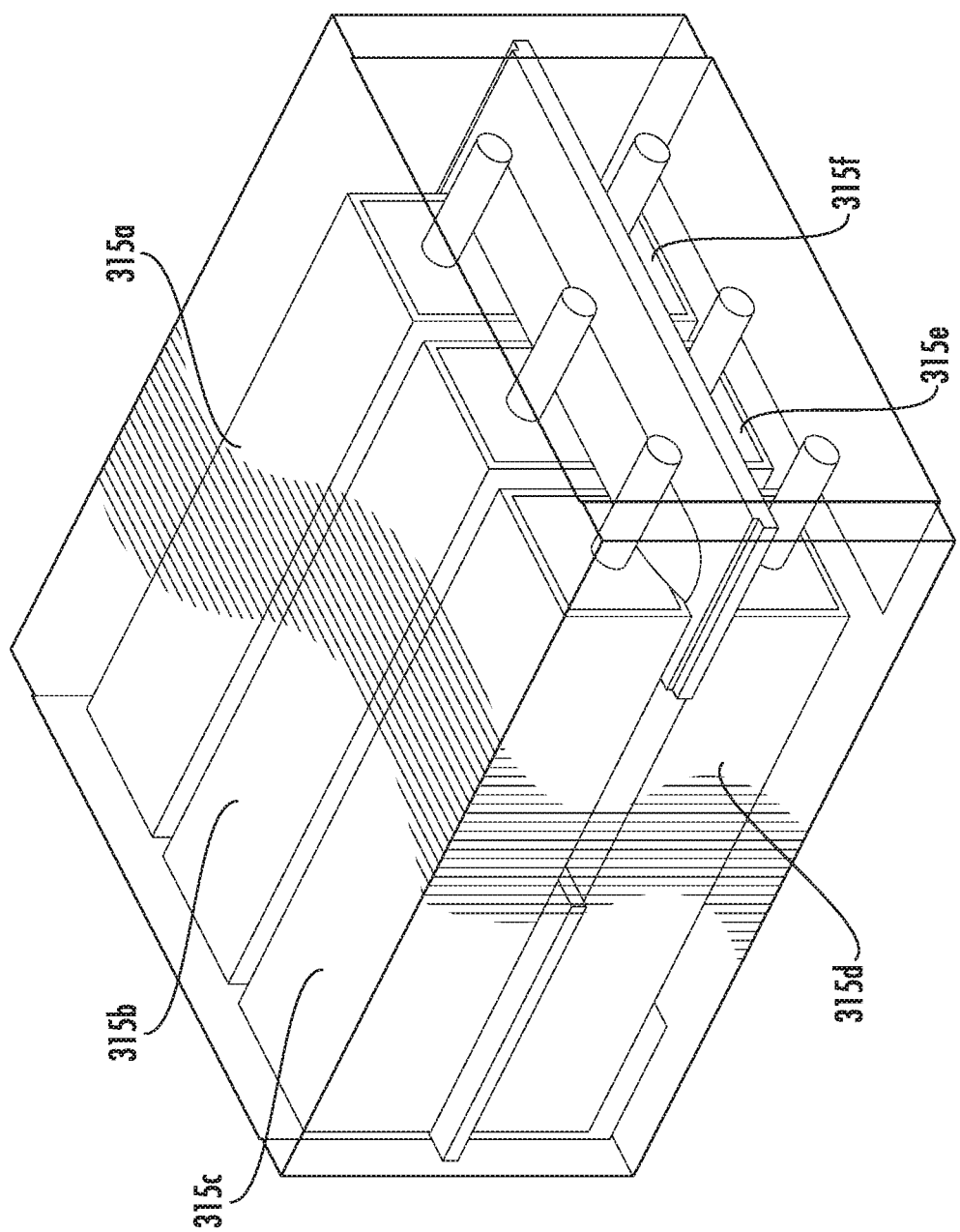
FIG. 10A shows a perspective view in partial transparency of an embodiment of a MAP capacitor assembly according to the invention.
Figure 10B:
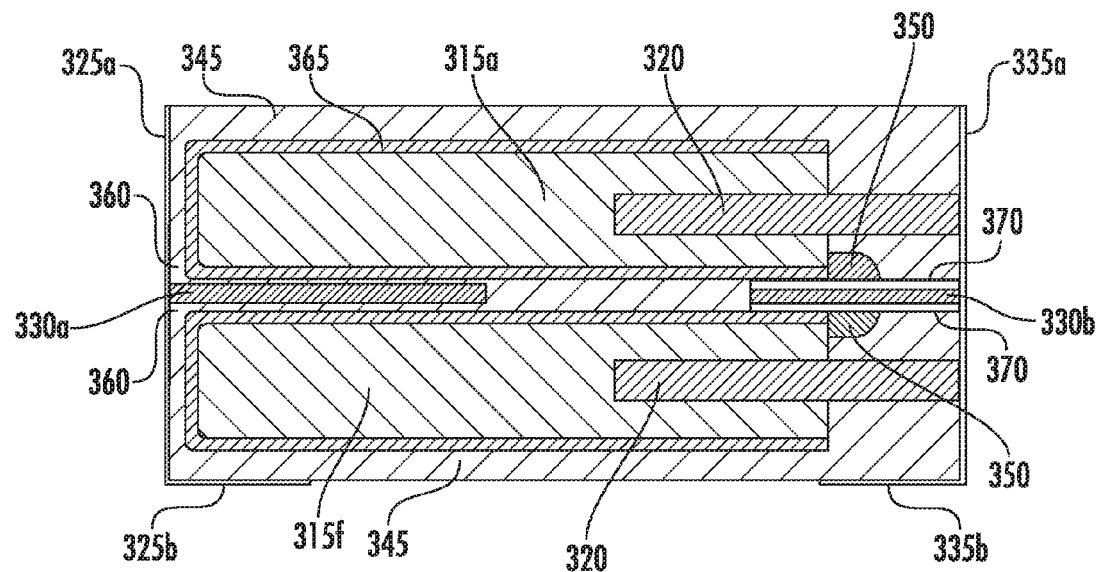
FIG. 10B shows a side cross-sectional view of the MAP capacitor assembly of FIG. 10A.
Figure 10C:
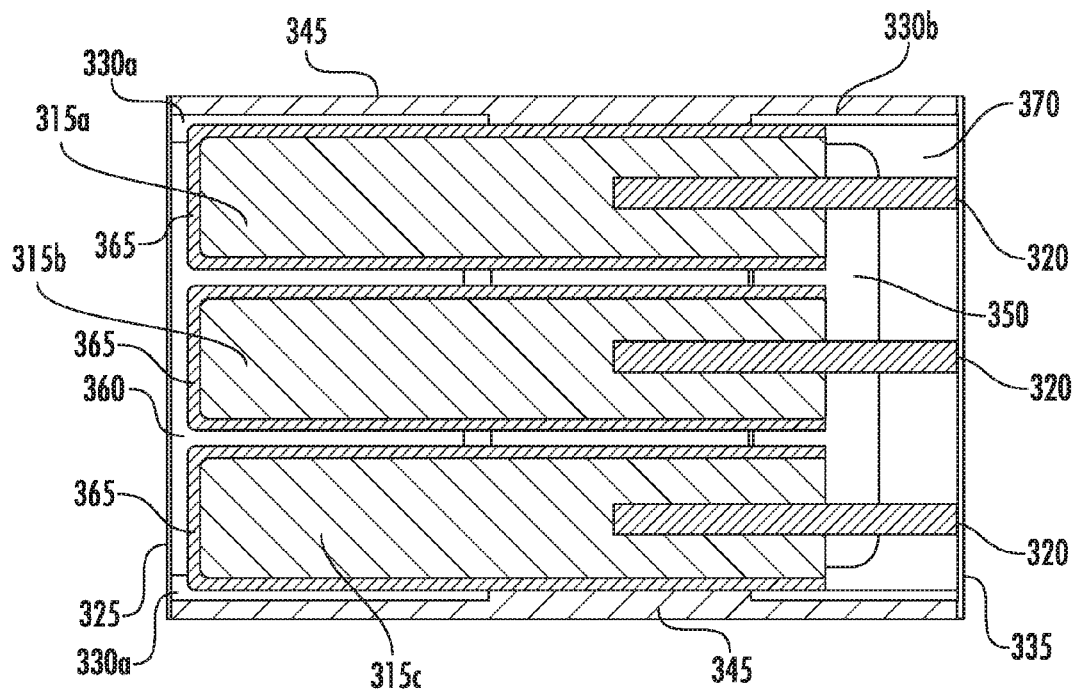
FIG. 10C shows a top cross-section view of the MAP capacitor assembly of FIG. 10A.

FIGS. 10A, 10B, and 10C show a six capacitor element arrangement according to the invention (relating to FIG. 4B (450), and shown in FIGS. 5 (515c) and (520c)). As shown in FIGS. 10A, 10B, and 10C, three capacitor elements 315a, 315b, and 315c, are positioned in parallel/side-by-side in a top or upper row of a stack. In addition, three capacitor elements 315d, 315e, and 315f, are positioned parallel/side-by-side in a bottom or lower row of the stack. As shown in FIGS. 10A, 10B, and 10C, the capacitor elements 315a and 315f, capacitor elements 315b and 315e, and capacitor elements 315c and 315d, have facing conductive adhesive epoxy 360, joining each conductive cathode coating 365 to the cathode terminal substrate 330a. At the anode end portions of the capacitor elements, the anode terminal substrate 330b is coated on its top and bottom surfaces with non-conductive protective strips 370. An insulating adhesive epoxy 350 bonds the anode portions of the capacitor elements 315a, 315b to the protective strips 370.

A generally L-shaped cathode terminal has a first portion 325a along a cathode surface of the capacitor package, and a second portion 325b along a lower surface of the of the capacitor package adjacent the cathode. The cathode terminal 325a, 325b is electrically connected to each cathode 365 via the conductive adhesive epoxy 360. A generally L-shaped anode terminal has a first portion 335a along an anode surface of the capacitor package, and a second portion 335b along a lower surface of the of the capacitor package adjacent the anode. These configurations allow for a surface mountable device. The arrangements of FIGS. 10A, 10B, and 10C provide for stacked capacitor elements, while still efficiently utilizing the available volume for the capacitor packages.

Figure 11:
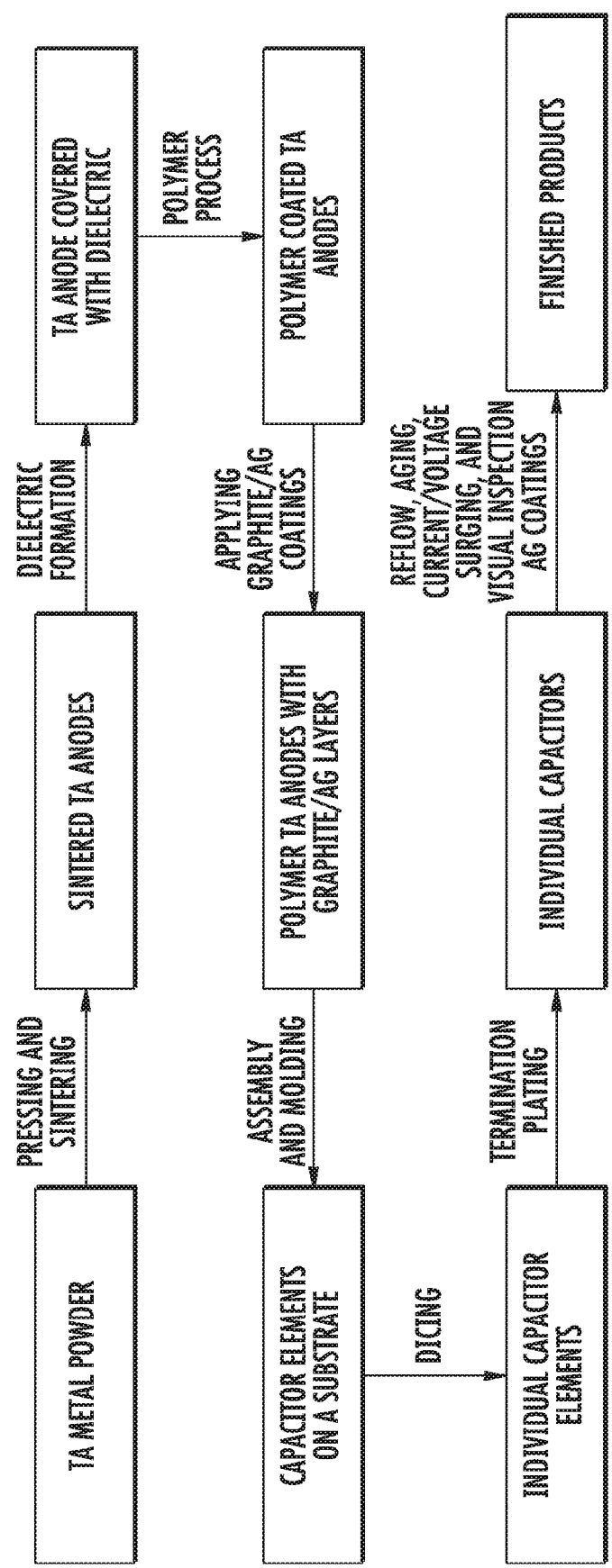
FIG. 11 shows a diagrammatic flow chart describing a process for making tantalum capacitors according to an aspect of the invention.

FIG. 11 shows an illustrative process chart for manufacturing devices according to the present invention. Capacitor elements are produced after powder pressing and sintering, dielectric formation, polymer coating, and forming of graphite and Ag layers. Single or multiple capacitor elements are then assembled and/or stacked, and molded into packs and/or blocks, which are subsequently diced to form individual devices. Anode and cathode terminations are formed by plating metal layers onto the devices. The process can be outlined as follows:

(a) Tantalum metal powder is pressed and sintered to form sintered tantalum anode pellets.

(b) A dielectric formation process forms a dielectric at a surface of the tantalum anode pellets. The capacitor dielectric formation is generally made by anodic oxidation of the anode material to form an oxide layer over the surface of the anode body (e.g., Ta to $Ta_2O_5$).

(c) Tantalum anodes are processed by coating the anodes with a conducting polymer to form a cathode layer (d) The anodes were then coated with graphite and silver paste to form current collecting layers.

(e) The capacitor elements are assembled and molded onto a substrate.

(f) The capacitor elements are diced to form individual capacitor elements.

(g) Terminations are plated onto the individual capacitor elements.

(h) After aging and testing, the capacitors may be screened to ensure quality and reliability of the products. This is accomplished by applying a pre-determined voltage that is higher than the voltage rating under elevated temperatures from. The pre-determined voltage may be, for example, selected from a range of about 130% and about 250% of the rated voltage. The elevated temperatures can preferably range of about 85 degrees C. to about 150 degrees C. Parts (screened devices) are considered to pass the screening process if they show DC leakage current (DCL) below a pre-determined value derived from statistical analysis of the population measured at the elevated temperature.

Figure 12:
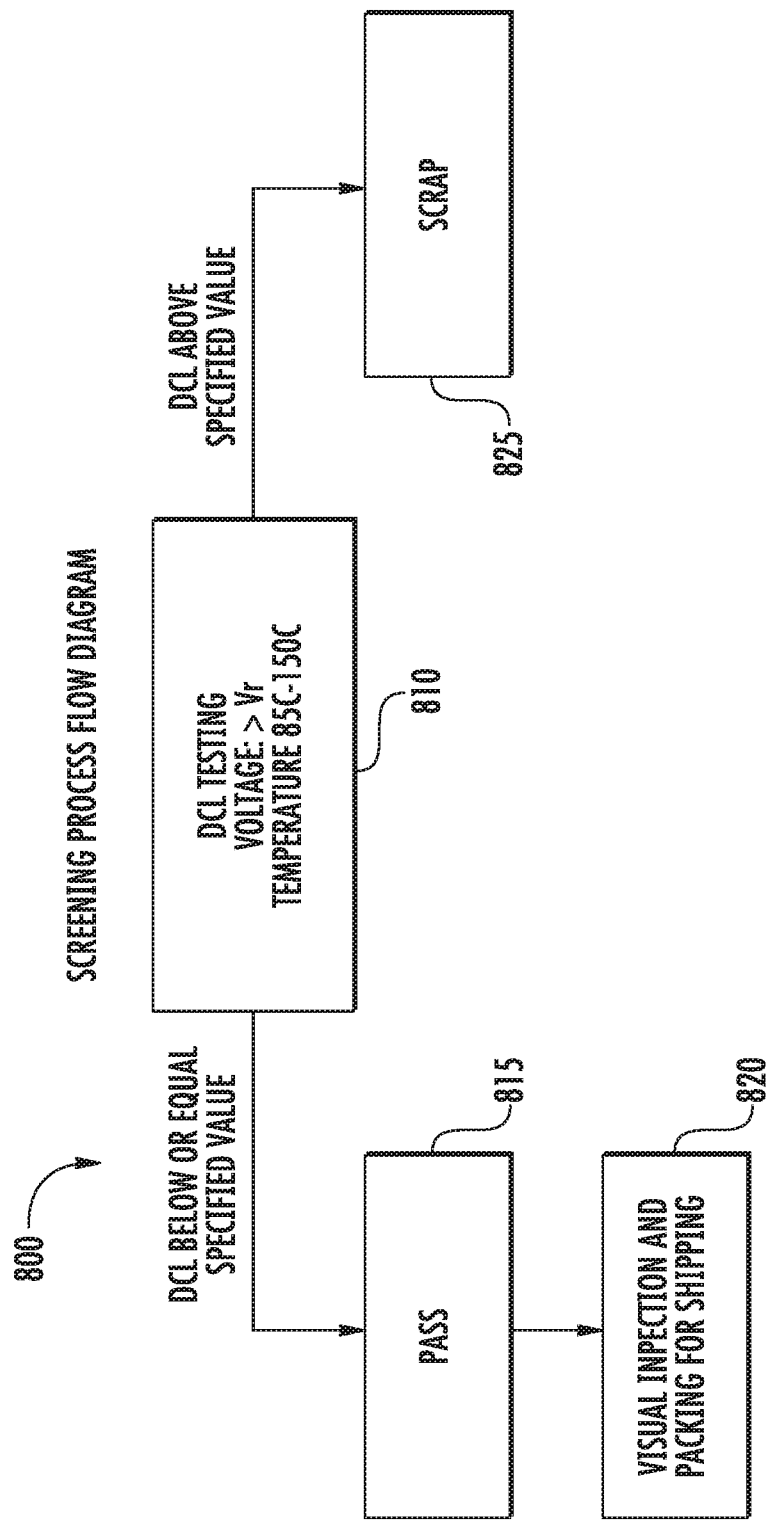
FIG. 12 shows a diagram of a screening process according to the invention.

FIG. 12 shows an illustrative screening process 800 according to the invention. Capacitors being screened are biased with a voltage that exceeds their voltage rating (Vr) in an elevated temperature environment 810. If, after a predetermined time interval under these conditions, a capacitor's DC leakage current (DCL) does not exceed a predetermined maximum, the capacitor passes the screening 815. Passing capacitors are visually inspected and packed for shipping 820. Alternatively, capacitors having DCL exceeding the maximum are regarded as not passing the screening, and are scrapped 825.

Advantages of screening at elevated temperature include that the screening is more sensitive and efficient since leakage current in general becomes higher with increasing temperature. This avoids over-stress of the screened parts when applying a voltage that is near or exceeding to their breakdown voltage during the screening process.

While DCL screening has been used to some extent in the relevant industry, it has been discovered that the combination of screening at an elevated temperature while also applying a high enough voltage yields surprisingly positive results that would not have been anticipated. Namely, not only does this process it screen out the "weak" population fraction of the devices being tested, it also makes the remaining population (the "passing" population) more robust and resistant to electrical stress, thereby noticeably enhancing the reliability performance of the "passing" population of devices.

The low ESR/ESL advantages of the inventive concepts are illustrated in Example 1. The enhanced reliability benefits are illustrated in Examples 2, 3, and 4.

Example 1

170 uF 16V rated Ta anodes were coated with conducting polymer to form cathode layers. The anodes were then coated with graphite and silver paste to form the current collecting layers. The anodes were assembled on a substrate using a multi-array package (MAP) process. Two anodes were connected by stacking such as depicted for example in FIGS. 8A, 8B, and 8C, to make a 330 uF 16V capacitor. After reflow treatment, aging, current and voltage surge, visual inspection, and DCL screening at 30V under 125 degrees C., the finished capacitors have an ESR value less than 15 mOhm and ESL less than 2.3 nH at 20M Hz. The ESR performance of this device is far superior to its single anode counterpart, which has an ESR of 25 mOhm.

Example 2

47 uF 16V rated Ta anodes were coated with conducting polymer to form a cathode layer. The anodes were then coated with graphite and silver paste to form the current collecting layers. A single anode was assembled on a substrate using a multi-array package (MAP) process. After reflow treatment, aging, current and voltage surge, and visual inspection, four groups of test samples were selected from the same lot and each group was subjected to 0V, 15V, 23V, and 34V, respectively, for 90 seconds under 125 degrees C. After screening out the failed parts, a breakdown voltage test was performed onto each group. During the breakdown voltage test, an increasing voltage was applied to capacitors and the voltage at which the part failed were monitored and recorded.

Figure 13:
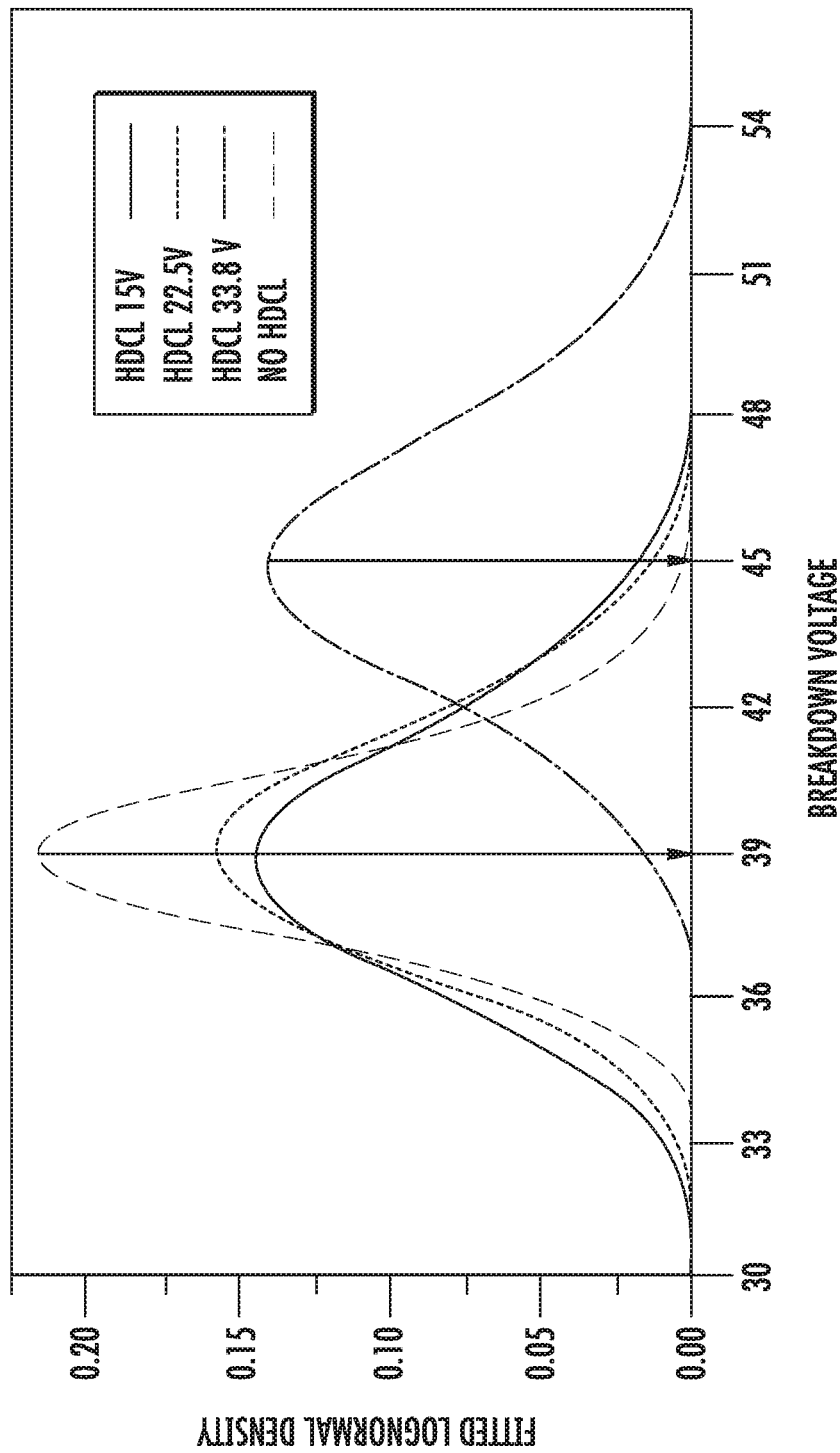
FIG. 13 shows a graph of the impact of DCL screening at various voltages under elevated temperature according to an aspect of the present invention.

The breakdown voltage test results are shown in FIG. 13, with "HDCL" indicating "Hot" (e.g., elevated temperature) DCL screening. As can be ascertained by the results shown in FIG. 13, the average values of breakdown voltage are 39V even as screening voltage increases to 15.5V and 22.5V. However, applying a sufficiently high voltage, for example, 33.8V (211% of the rated voltage), the average breakdown voltage increases from 39V to 45V, yielding a noticeable improvement. The results show that screening at an elevated temperature effectively enhances the reliability of the products if a proper voltage is selected.

Example 3

Figure 14:
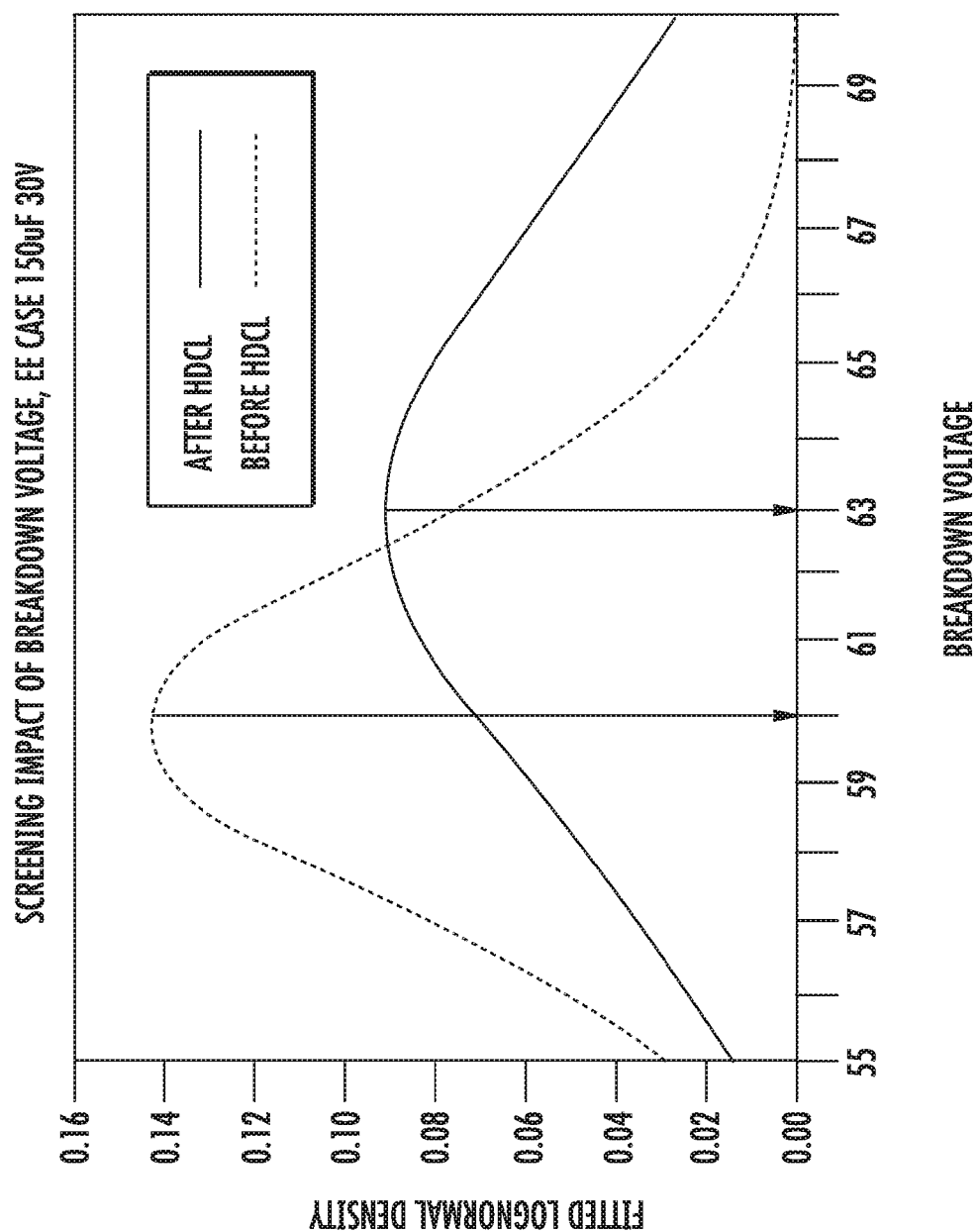
FIG. 14 shows a graph of the impact of DCL screening on breakdown voltage of EE case 150 uF 30V capacitors.

75 uF 30V rated Ta anodes were coated with conducting polymer to form a cathode layer. The anodes were then coated with graphite and silver paste to form the current collecting layers. Two anodes were assembled and stacked using a multi-array package (MAP) process to make a 150 uF 30V capacitor. After reflow treatment, aging, current and voltage surge, and visual inspection, a group of test sample was selected and subjected to 50V (167% of rated voltage) screening under 125 degrees C. The breakdown voltage of this test group is compared to that of a group without screening, as shown in FIG. 14. The average breakdown voltage of the screen test group is 63V while the breakdown voltage of the group without screening is 60V.

Example 4

Figure 15:
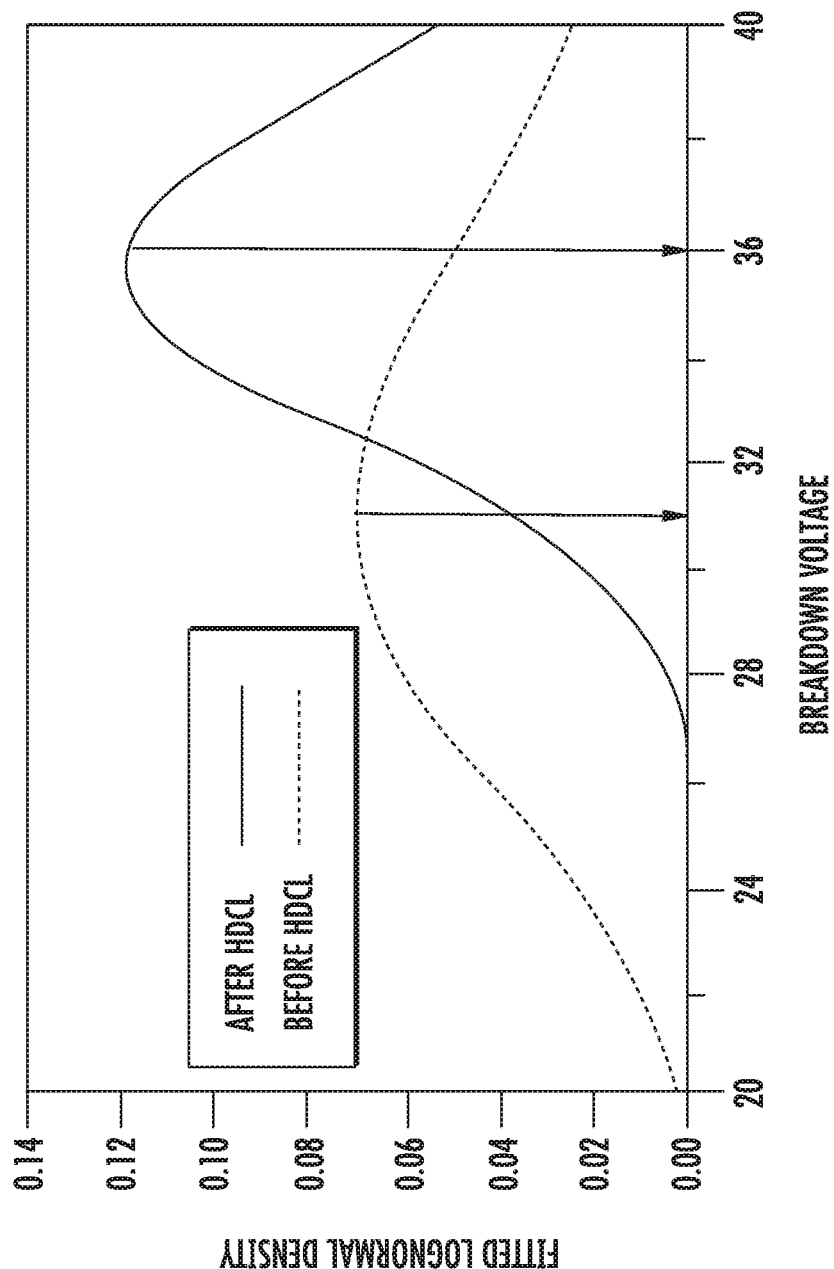
FIG. 15 shows a graph of the impact of DCL screening on breakdown voltage of EE case 470 uF 16V capacitors.

240 uF 16V rated Ta anodes were coated with conducting polymer to form a cathode layer. The anodes were then coated with graphite and silver paste to form the current collecting layers. Two anodes were assembled by stacking using a multi-array package (MAP) process to make a 470 uF 16V capacitor. After reflow treatment, aging, current and voltage surge, and visual inspection, a group of test sample was selected and subjected to 23V (143% of rated voltage) screening under 125 degrees C. The breakdown voltage of this test group is compared to that of a group without screening, as shown in FIG. 15. The average breakdown voltage of the screen test group is 36V while the breakdown voltage of the group without screening is 31V.

The improvement of breakdown voltage by screening at an elevated temperature is both noteworthy and useful. In order to obtain the benefit, the screening voltage should set sufficiently high. However, too high of a screening voltage will significantly reduce the yield, or possibly even degrade the dielectric performance if the voltage is approaching or exceeding the breakdown voltage of the products. Therefore, the screening voltage should be selected properly within an optimal range. For optimal performance, the screening voltage should preferably be equal to or greater than approximately 1.3 times the rated voltage. A screening voltage range of approximately 1.3 times to approximately 2 times the rated voltage may be used.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method for screening a capacitor having a multi-array package design, comprising the steps of:
    forming the capacitor by arranging a first capacitor element comprising a first anode and a second capacitor element comprising a second anode, the first capacitor element and the second capacitor element arranged in parallel in a multi-array package;
    applying a voltage exceeding a voltage rating of the capacitor;
    applying an elevated temperature to the capacitor;
    wherein the voltage and temperature are selected in such a manner that a breakdown voltage of the capacitor is improved;
    measuring a DC leakage current of the capacitor; and,
    comparing the DC leakage current to a predetermined maximum DC leakage current.

2. The method of claim 1, wherein the step of applying a voltage exceeding the voltage rating of the capacitor comprises applying a voltage selected from a range of between about 130% and about 250% of the voltage rating of the capacitor.

3. The method of claim 1, wherein the step of applying a voltage exceeding the voltage rating of the capacitor comprises applying a voltage that is about 1.3 to 2 times the voltage rating of the capacitor.

4. The method of claim 1, wherein the elevated temperature is selected from a range of between about 85 degrees C. and about 150 degrees C.

5. The method of claim 1, further comprising the step of determining that the capacitor is acceptable if the capacitor's DC leakage current does not exceed the predetermined maximum DC leakage current.

6. The method of claim 1, further comprising the step of determining that the capacitor is not acceptable if the capacitor's DC leakage current exceeds the predetermined maximum DC leakage current.

7. The method of claim 1, wherein the capacitor elements comprise anode wires, and wherein the anode wires are arranged in parallel.

8. The method of claim 1, wherein the first and a second capacitor elements are each formed according to a process comprising the steps of:
    pressing and sintering tantalum metal powder to form sintered tantalum anode pellets;

forming a dielectric at a surface of each tantalum anode pellet by anodic oxidation;
processing each of the tantalum anode pellets by coating the anode pellets with a conducting polymer to form a cathode layer;
coating the anode pellets to form current collecting layers;
assembling the first and second capacitor elements in parallel on a substrate;
molding a multi-array package body around the first and second capacitor elements;
singulating the multi-array package into individual capacitors; and
plating terminations onto the multi-array package body to form a capacitor.

9. The method of claim 1, wherein the capacitor elements comprise anode wires and wherein the anode wires are arranged in a stack.

10. The method of claim 1, wherein the capacitor comprises a plurality of anodes, and wherein the anodes are arranged in a stack.

* * * * *